United States Patent
Doris et al.

(10) Patent No.: US 9,666,693 B1
(45) Date of Patent: May 30, 2017

(54) STRUCTURE AND METHOD TO MINIMIZE JUNCTION CAPACITANCE IN NANO SHEETS

(71) Applicant: International Business Machines Corporation, Armonk, NY (US)

(72) Inventors: Bruce B. Doris, Slingerlands, NY (US); Terence B. Hook, Jericho, VT (US); Xin Miao, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/295,130

(22) Filed: Oct. 17, 2016

Related U.S. Application Data

(60) Continuation of application No. 15/149,293, filed on May 9, 2016, now Pat. No. 9,515,138, which is a division of application No. 14/969,170, filed on Dec. 15, 2015.

(51) Int. Cl.
| | |
|---|---|
| *H01L 29/78* | (2006.01) |
| *H01L 21/336* | (2006.01) |
| *H01L 29/417* | (2006.01) |
| *H01L 29/06* | (2006.01) |
| *H01L 29/786* | (2006.01) |
| *H01L 29/66* | (2006.01) |
| *H01L 21/306* | (2006.01) |
| *H01L 21/311* | (2006.01) |
| *H01L 29/08* | (2006.01) |

(52) U.S. Cl.
CPC .... *H01L 29/6681* (2013.01); *H01L 21/30604* (2013.01); *H01L 21/31116* (2013.01); *H01L 29/0653* (2013.01); *H01L 29/0673* (2013.01); *H01L 29/0847* (2013.01); *H01L 29/6653* (2013.01); *H01L 29/6656* (2013.01); *H01L 29/66553* (2013.01); *H01L 29/7853* (2013.01)

(58) Field of Classification Search
CPC ........... H01L 29/7848; H01L 29/66795; H01L 29/6053; H01L 21/30604; H01L 21/31111
USPC .................. 257/192, 327, 351; 438/283, 197
See application file for complete search history.

(56) References Cited

U.S. PATENT DOCUMENTS

2009/0008705 A1* 1/2009 Zhu .................. H01L 29/66795
257/327

* cited by examiner

*Primary Examiner* — Kimberly Rizkallah
*Assistant Examiner* — Brian Turner
(74) *Attorney, Agent, or Firm* — Cantor Colburn LLP; Vazken Alexanian

(57) ABSTRACT

A method of making a semiconductor device includes forming a nanosheet stack including a first layer and a second layer; patterning a gate stack on the nanosheet stack; forming a first spacer along a sidewall of the gate stack; removing an endwall portion of the nanosheet stack that extends beyond the first spacer such that a portion of the second layer is exposed from a sidewall of the first spacer; depositing a second spacer along a sidewall of the first spacer; recessing the substrate beneath the second spacer to form an isolation region; depositing an oxide on the gate stack and within the isolation region and partially recessing the oxide; removing a portion of the second spacer such that the portion of the second layer is exposed; and growing an epitaxial layer on the portion of the second layer that is exposed to form a source/drain over the isolation region.

20 Claims, 15 Drawing Sheets

US 9,666,693 B1

STRUCTURE AND METHOD TO MINIMIZE JUNCTION CAPACITANCE IN NANO SHEETS

DOMESTIC PRIORITY

This application is a continuation of and claims priority from U.S. patent application Ser. No. 15/149,293, filed on May 9, 2016, entitled "STRUCTURE AND METHOD TO MINIMIZE JUNCTION CAPACITANCE IN NANO SHEETS," which is a divisional of and claims priority from U.S. patent application Ser. No. 14/969,170, filed on Dec. 15, 2015, entitled "STRUCTURE AND METHOD TO MINIMIZE JUNCTION CAPACITANCE IN NANO SHEETS," each application is incorporated herein by reference in its entirety.

BACKGROUND

The present invention relates to complementary metal oxide semiconductor (CMOS), and more specifically, to methods and structures to nanosheet devices.

CMOS is used for constructing integrated circuits. CMOS technology is used in microprocessors, microcontrollers, static RAM, and other digital logic circuits. CMOS designs may use complementary and symmetrical pairs of p-type and n-type metal oxide semiconductor field effect transistors (MOSFETs) for logic functions.

The MOSFET is a transistor used for switching electronic signals. The MOSFET has a source, a drain, and a metal oxide gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

As CMOS scales to smaller dimensions, nanosheet devices provide advantages. Stacked nanosheets provide area efficiency. Stacked sheets also provide increased drive current within a given layout area.

SUMMARY

According to an embodiment, a method of making a semiconductor device includes forming a nanosheet stack including a first layer arranged in contact with a substrate and a second layer arranged on the first layer; depositing and patterning a gate stack on the nanosheet stack; forming a first spacer along a sidewall of the gate stack; removing an endwall portion of the nanosheet stack that extends beyond the first spacer such that a portion of the second layer is exposed from a sidewall of the first spacer; depositing a second spacer along a sidewall of the first spacer; recessing the substrate beneath the second spacer to form an isolation region beneath the second spacer; depositing an oxide on the gate stack and the substrate within the isolation region and partially recessing the oxide to expose the second spacer; removing a portion of the second spacer such that the portion of the second layer is exposed; and growing by an epitaxial process an epitaxial layer on the portion of the second layer that is exposed to form a source/drain over the isolation region.

According to another embodiment, a method of making a semiconductor device includes forming a nanosheet stack including a first layer arranged in contact with a substrate and a second layer arranged on the first layer; depositing and patterning a gate stack on the nanosheet stack; forming a first spacer along a sidewall of the gate stack; removing an endwall portion of the nanosheet stack that extends beyond the first spacer such that a portion of the second layer is exposed from a sidewall of the first spacer; depositing a second spacer along a sidewall of the first spacer to cover the portion of the second layer that is exposed from the sidewall of the first spacer; performing an etch to recess the substrate beneath the second spacer to form a recess beneath the second spacer, the substrate abutting the first spacer; depositing an oxide on the gate stack and the substrate within the recess and partially recessing the oxide to expose the second spacer; removing a portion of the second spacer such that the portion of the second layer is exposed from a sidewall of the second spacer; and growing by an epitaxial process an epitaxial layer on the portion of the second layer that is exposed to form a source/drain over the isolation region.

Yet, according to another embodiment, a semiconductor device includes a gate arranged on a substrate; a gate spacer disposed on a sidewall of the gate, a portion of the substrate abutting the gate and the gate spacer, and a portion of the substrate being recessed in a region adjacent to the gate; a channel region beneath the gate that includes a nanosheet that extends through the gate and is exposed from a sidewall of the gate spacer; a source/drain comprising an epitaxial layer disposed on an exposed endwall portion of the nanosheet; and an oxide disposed on the substrate within the region that is recessed and the gate; wherein the region of the substrate that is recessed is arranged beneath the epitaxial layer of the source/drain.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

FIGS. 1-15 illustrate exemplary methods of making a nanosheet device according to embodiments, in which:

FIG. 1 is a cross-sectional side view of a bulk substrate;

FIG. 2 is a cross-sectional side view after forming alternating layers on the bulk substrate;

FIG. 3 is a cross-sectional side view after patterning the nanosheet stacks and recessing the substrate to form a first stack and a second stack;

FIG. 4 is a cross-sectional side view after depositing an oxide around the first stack and second stack;

FIG. 5 is a cross-sectional side view after removing the hard mask layer on the first stack and the second stack;

FIG. 6 is a cross-sectional side view after partially recessing the oxide;

FIG. 7 is a cross-sectional side view after patterning gate stacks on the nanosheet stacks;

FIG. 8 is a cross-sectional side view after forming a first spacer on a sidewall of the gate stack;

FIG. 9 is a cross-sectional side view after removing that portion of the excess layers extending beyond the first spacer;

FIG. 10 is a cross-sectional side view after forming a second spacer along a sidewall of the first spacer;

FIG. 11 is a cross-sectional side view after partially recessing the substrate beneath the second spacer;

FIG. 12 is a cross-sectional side view after depositing an oxide on the gate stacks;

FIG. 13 is a cross-sectional side view after partially recessing the oxide;

FIG. 14 is a cross-sectional side view after removing a portion of the second spacer; and FIG. 15 is a cross-sectional side view after growing an epitaxial layer over the recessed substrate to form the source/drain.

DETAILED DESCRIPTION

In nanosheet devices, there is a parasitic capacitance from the source/drain node to the underlying substrate. Accordingly, various embodiments address the challenge of parasitic capacitance and provide methods of making nanosheet devices by forming an isolation region in the substrate in the source/drain regions.

Figure 1:
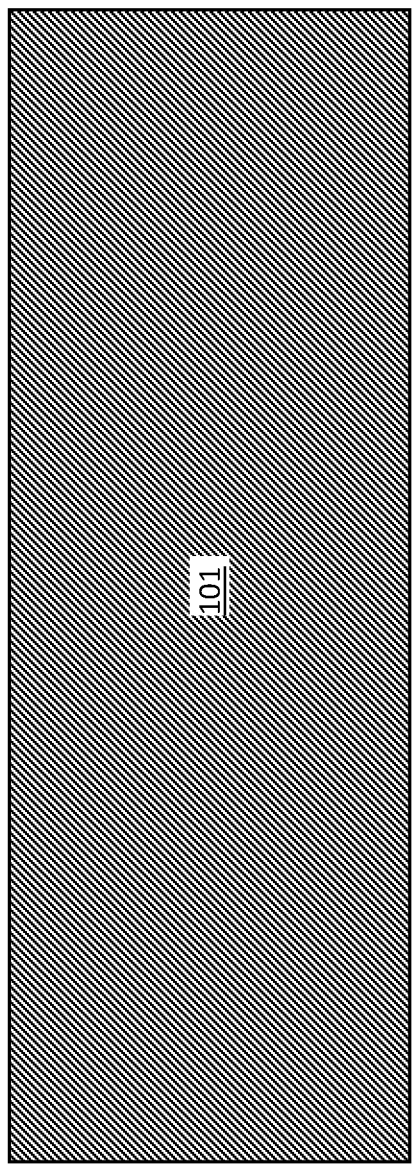

Turning now to the Figures, FIGS. 1-15 illustrate exemplary methods of making a nanosheet device according to embodiments. FIG. 1 is a cross-sectional side view of a bulk substrate 101. The substrate 101 may include one or more semiconductor materials. Non-limiting examples of suitable substrate 101 materials include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. The thickness of the substrate 101 may be in a range from about 600 to about 1000 microns (m).

Figure 2:
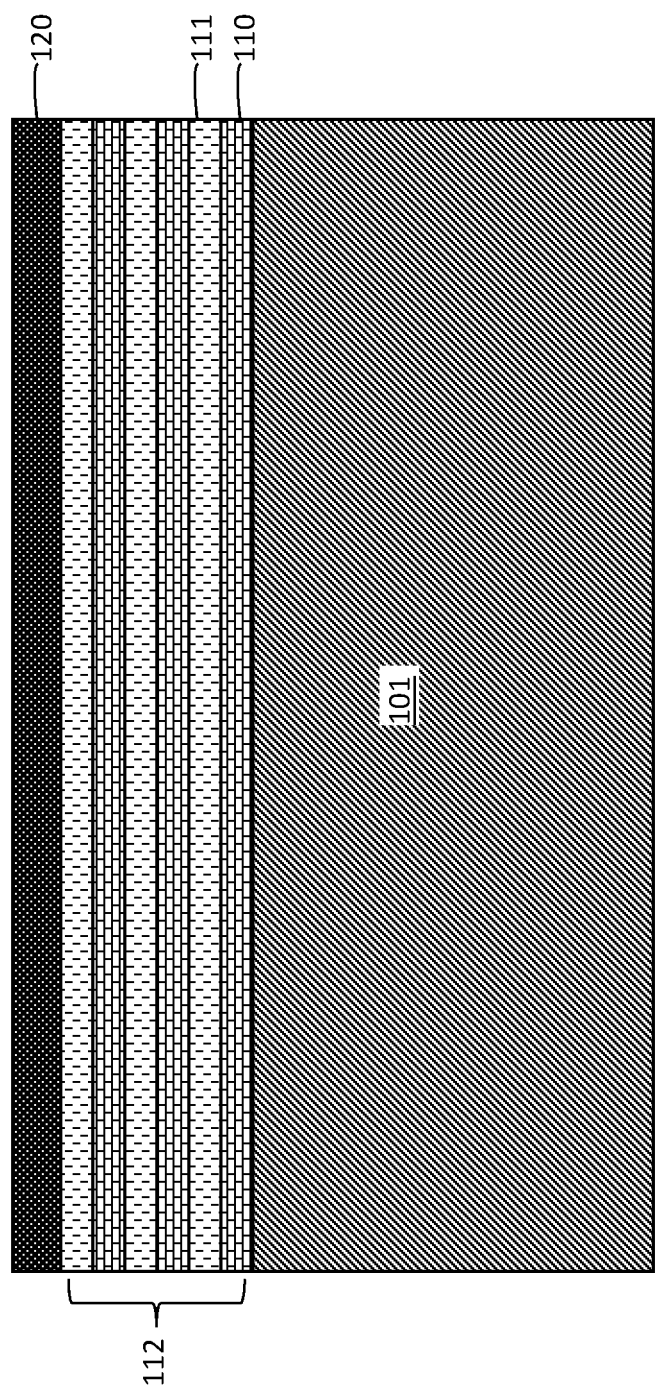

FIG. 2 is a cross-sectional side view after forming a nanosheet stack 112 and hard mask layer 120 on the substrate 101. The nanosheet stack 112 is arranged on the substrate 101, and the hard mask layer 120 is arranged on the nanosheet stack 112. The nanosheet stack 112 includes a first layer 110 and a second layer 111. The first layer 110 and the second layer 111 alternate within the nanosheet stack 112. Although the nanosheet stack 112 shown in the exemplary embodiment includes three alternating layers of the first layer 110 and the second layer 111, the nanosheet stack 112 may include any number of first layers 110 and second layers 111. The nanosheet stack 112 may include one or more layers of each of the first layer 110 and the second layer 111. For example, nanosheet stack 112 may include one layer of first layer 110 positioned in contact with the substrate 101 and one layer of second layer 111 disposed on the first nanosheet 110.

The first layer 110 is a sacrificial material that will be subsequently removed before final metal gate formation, which is described below following FIG. 15. The second layer 111 will remain in the final device. The metal gate will be disposed on and around the second layer 111 and will be the nanosheet, which is described below.

First layer 110 and second layer 111 may be formed on the substrate 101 by for example, growing alternating layers of the first layer 110 material and the second layer 111 material (the thickness of the layers defines the thickness and the spacing of the nanosheets). First and second layers 110, 111 may be formed on the substrate 101 by for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes. The thickness of each of the first layer 110 may be in the range of about 10 to 15 nm, and the second layer 111 may be in a range from about 5 to about 10 nm.

The first layer 110 and the second layer 111 may include a semiconductor material. In an embodiment, the first layer 110 arranged on the substrate 101 includes silicon germanium, and the second layer 111 arranged on the first layer 110 is silicon. Other non-limiting examples of semiconductor materials for the first layer 110 and second layer 111 SiC (silicon carbide), Ge (germanium), SiGeC (silicon-germanium-carbon), Si alloys, Ge alloys, GaAs (gallium arsenide), InAs (indium arsenide), InP (indium phosphide), or any combination thereof.

A hard mask layer 120 is disposed on the nanosheet stack 112. The hard mask layer 120 provides an imaging layer used to pattern the nanosheet stack 112, as described in FIG. 3 below. The hard mask layer 120 may include, for example, silicon dioxide, silicon nitride, or a combination thereof.

Figure 3:
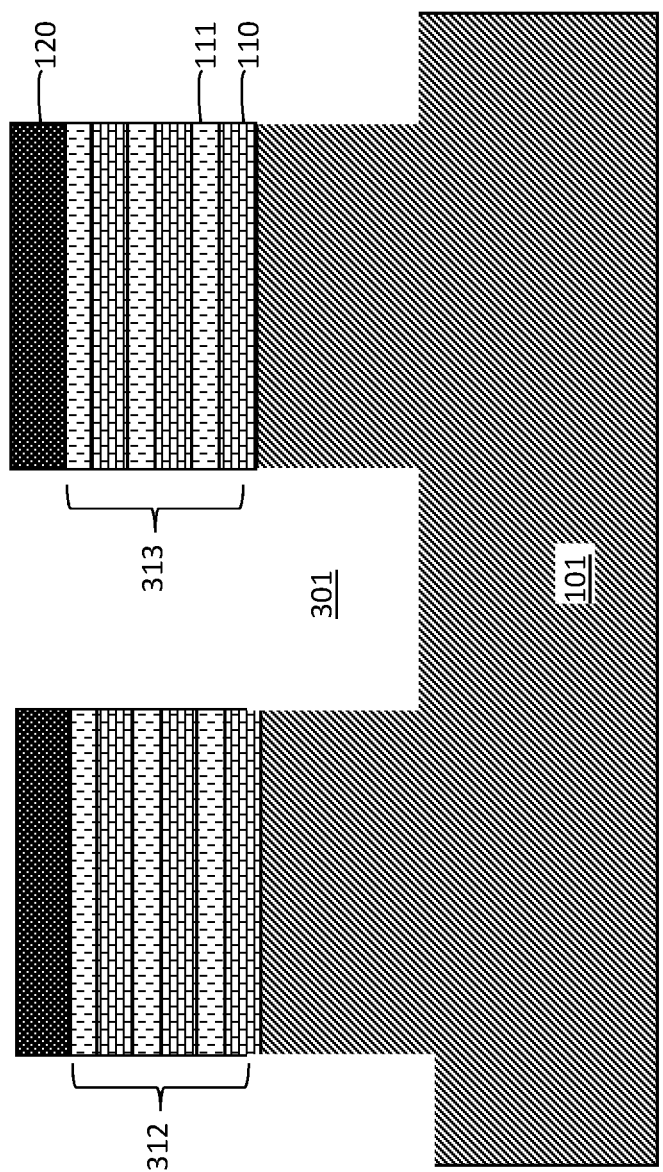

FIG. 3 is a cross-sectional side view after patterning the nanosheet stack 112 and recessing the substrate 101 to form a first nanosheet stack 312, a second nanosheet stack 313, and a trench 301 between the first nanosheet stack 312 and the second nanosheet stack 313.

The nanosheet stacks 312 and 313 may be formed using suitable lithography and etch processes. For example, a resist, such as a photoresist may be disposed on the hard mask layer 120, and then the photoresist may be exposed to a desired pattern of radiation to form a patterned resist. The pattern from the patterned resist is transferred into the nanosheet stack 112 by, for example, fluorine or chlorine-containing etchants such as $CF_4$, $SF_6$, $NF_3$, $Cl_2$, $CCl_2F_2$, or other such etchants.

The substrate 101 is then recessed to form one or more trenches 301 in the substrate 101 by, for example, an etch process with fluorine or chlorine-containing etchants such as described above. The substrate 101 may be recessed by about 200 to about 300 nm.

Figure 4:
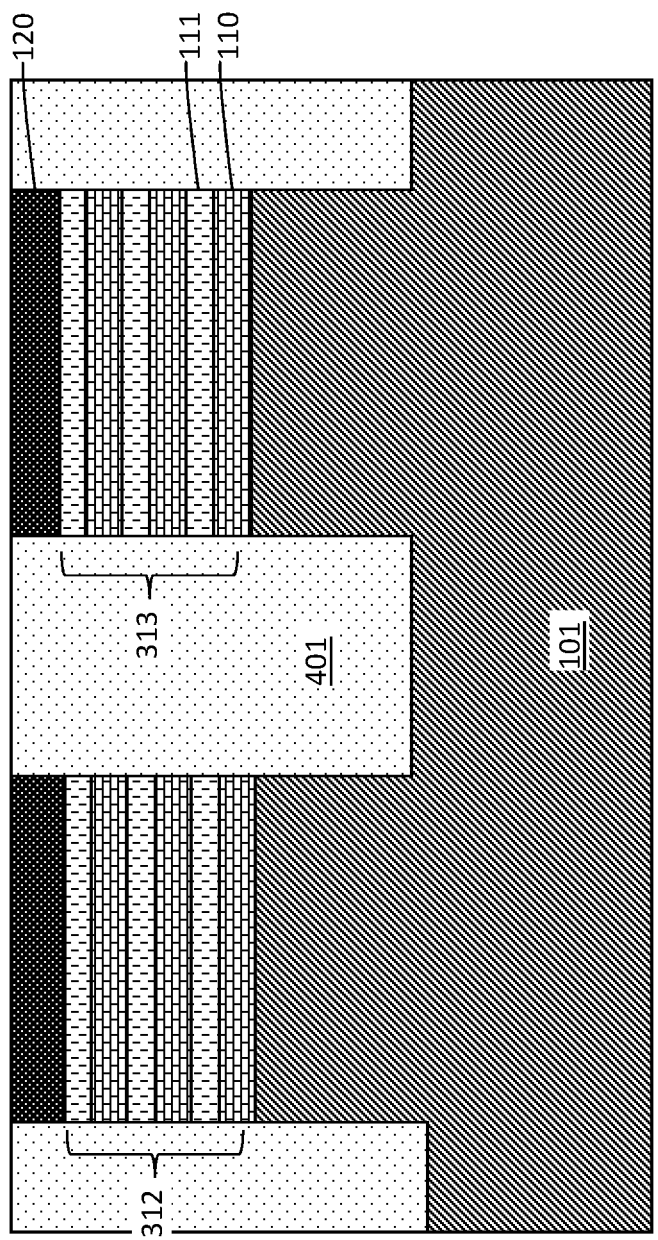

FIG. 4 is a cross-sectional side view after depositing an oxide 401 around the first nanosheet stack 312 and the second stack 313 and within the trenches 301. Non-limiting examples of oxides 401 include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. After depositing the oxide 401, the oxide 401 material is planarized/polished by, for example, chemical mechanical planarization (CMP), back stopping on the hard mask layer 120.

Figure 5:
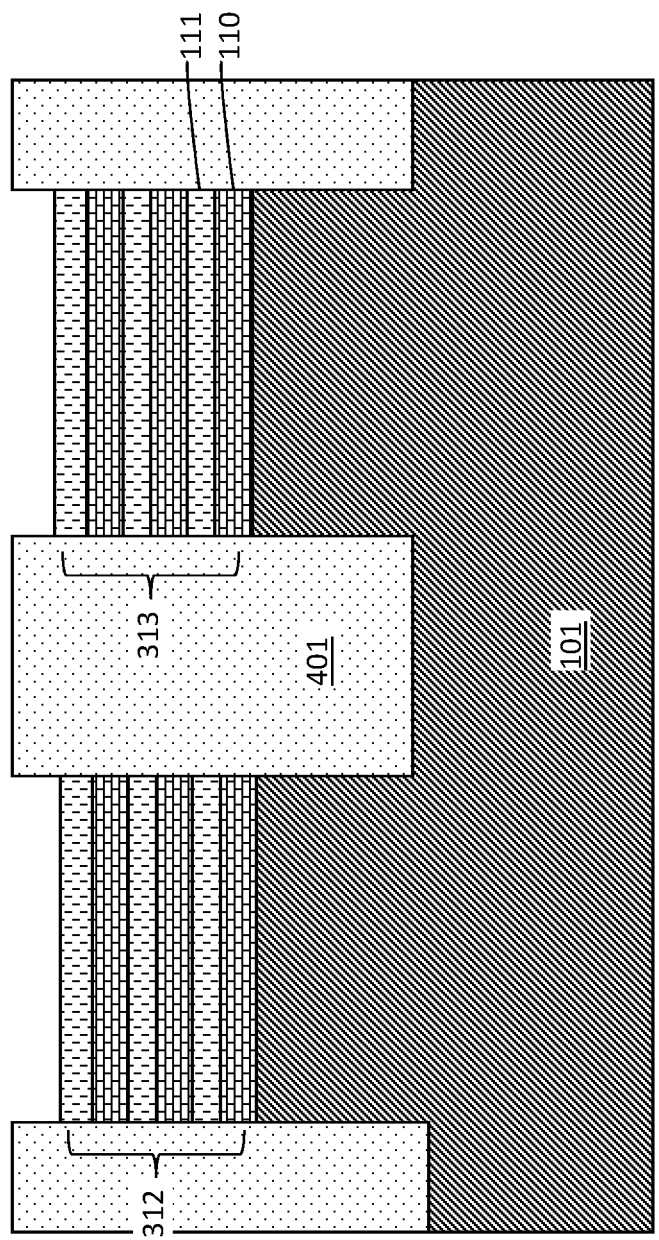

FIG. 5 is a cross-sectional side view after removing the hard mask layer 120 to expose the surface of the first nanosheet stack 312 and the second nanosheet stack 313. The hard mask layer 120 may be removed by a wet etch process. In an exemplary embodiment, the wet etch process may be a hot phosphoric acid process.

Figure 6:
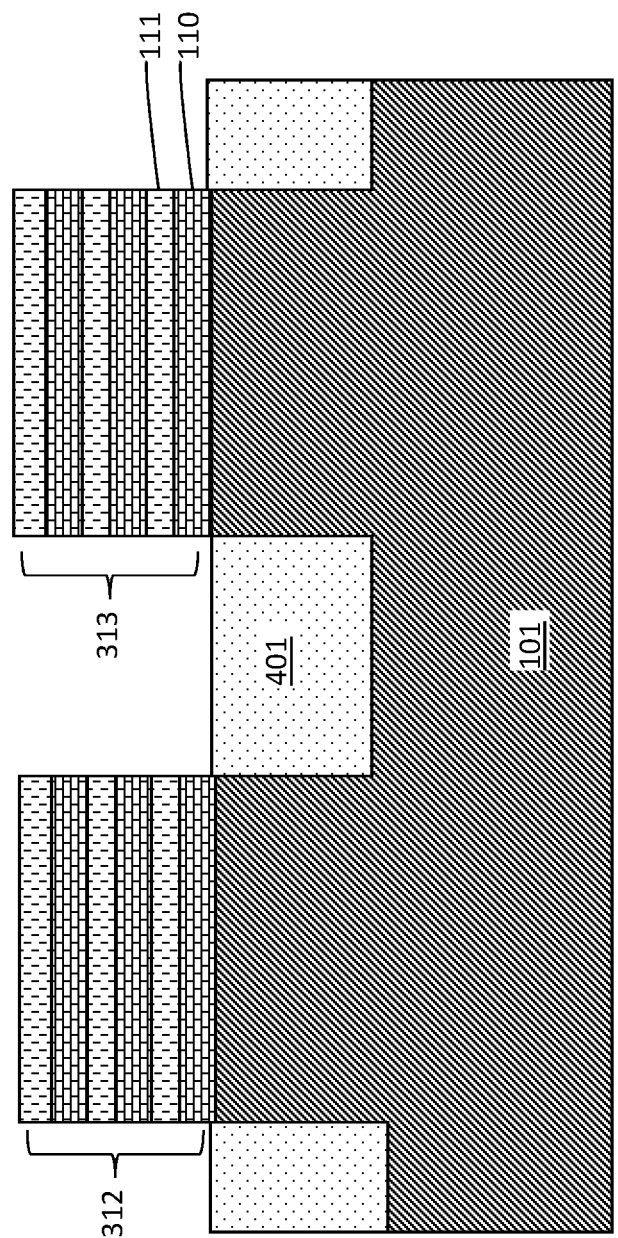

FIG. 6 is a cross-sectional side view after partially recessing the oxide 401. The oxide 401 is recessed to about the interface of the substrate 101 and the first and second nanosheet stacks 312, 313. The oxide 401 remains in the trenches 301 in the substrate 101 between the first nanosheet stack 312 and the second nanosheet stack 313. The oxide 401 may be recessed by a wet etch process. In an exemplary embodiment, the wet etch process may include a hydrofluoric acid process or other chemical oxide removal (COR) process.

Figure 7:
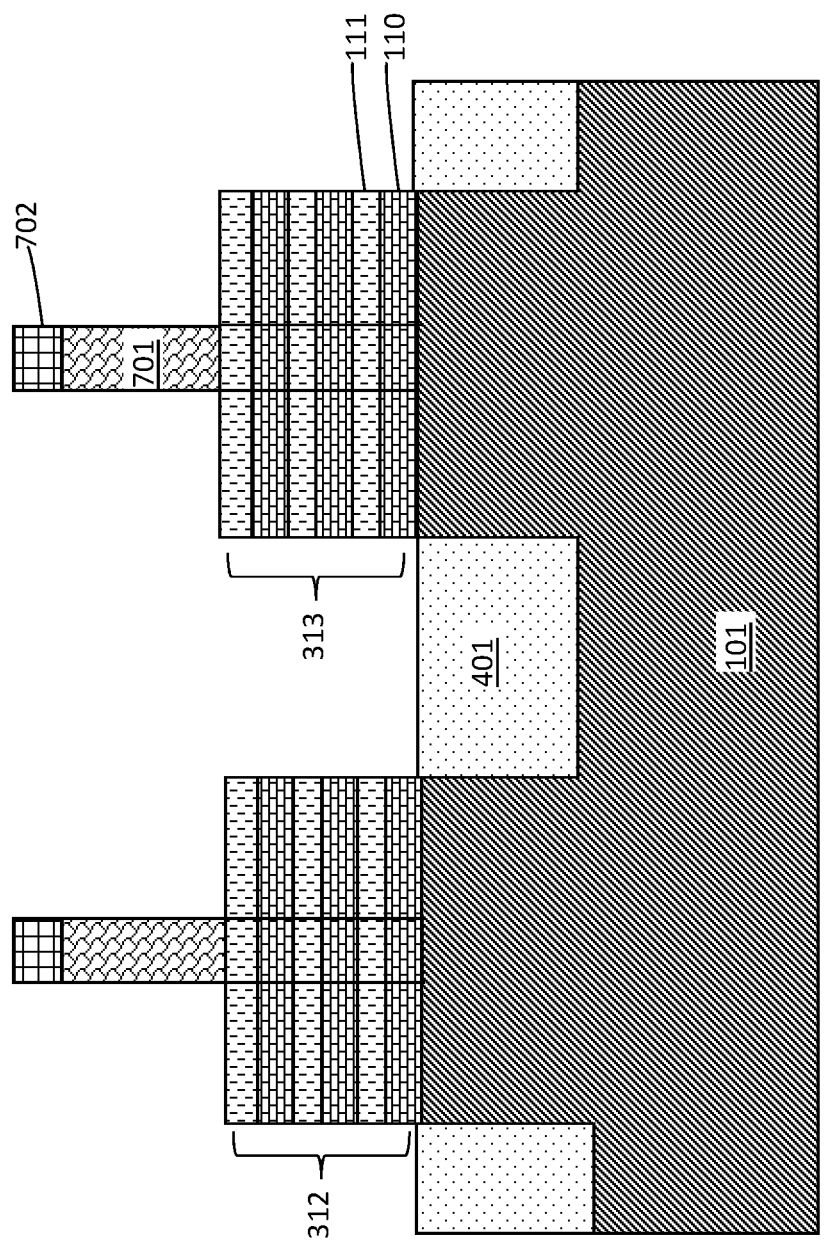

FIG. 7 is a cross-sectional side view after patterning dummy gate stacks 701 on the first and second nanosheet stacks 312, 313. A blanket sacrificial gate material, for example, amorphous silicon (aSi) or polycrystalline silicon (polysilicon), is deposited on the first and second nanosheet stacks 312, 313. The sacrificial gate material may be deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof.

A hard mask layer 702 is then deposited on the blanket sacrificial gate material. The hard mask layer 702 may include an insulating material, for example, silicon nitride (SiN), SiOCN, or SiBCN. The hard mask layer 702 may be deposited using a deposition process, including, but not limited to, PVD, CVD, PECVD, or any combination thereof.

The dummy gate stacks 701 and hard mask layer 702 are etched (defined) using lithography (e.g., using a photoresist). An etch process is performed to transfer the pattern from the lithographic mask into the sacrificial gate material and the hard mask layer 702. After etching, the dummy gate stacks 701 extend over the first nanosheet stack 312 and the second nanosheet stack 313. The nitride layer 702 forms a cap on the dummy gate stack 701.

Although the dummy gate stacks 701 are disposed on and around the first and second nanosheet stacks 312, 313, for clarity, the cross-section shown in the exemplary embodiment is through the central region of the dummy gate stacks 701.

Figure 8:
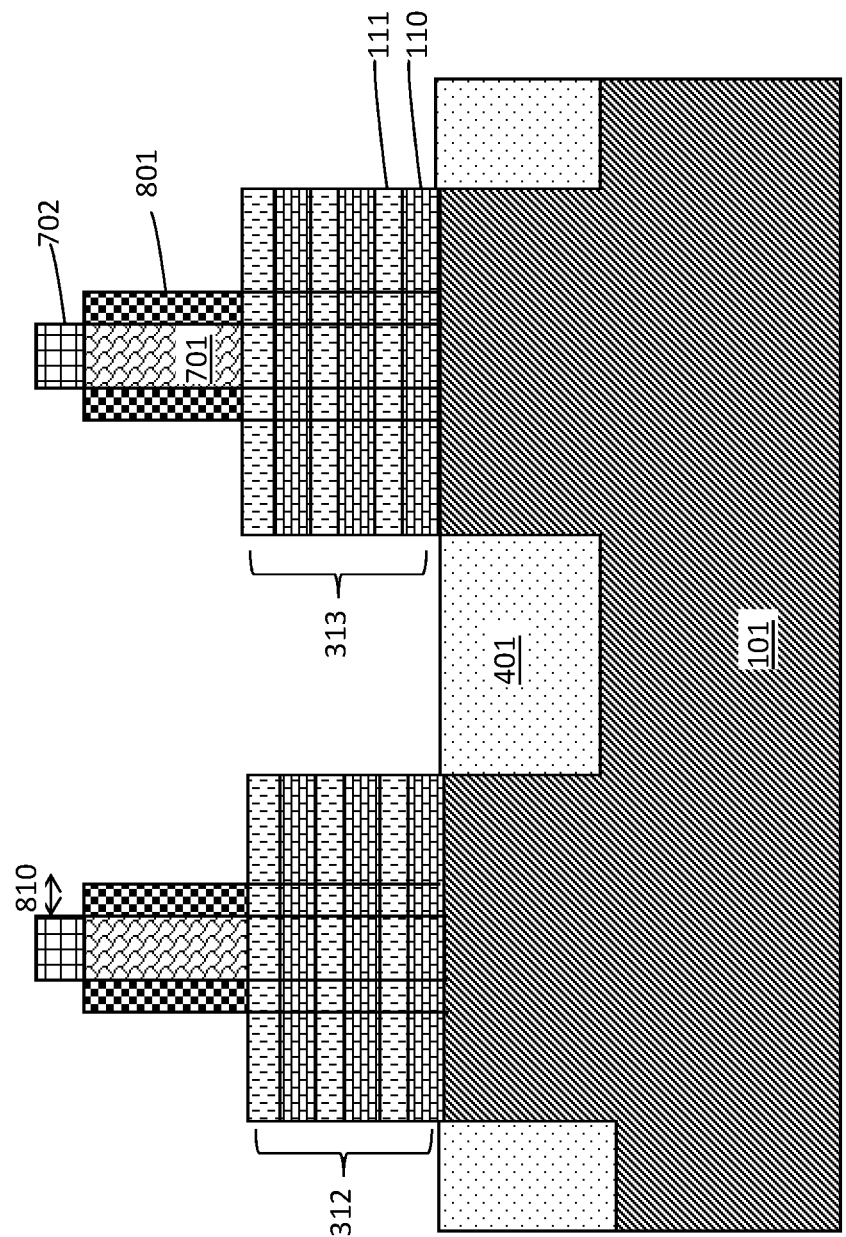

FIG. 8 is a cross-sectional side view after forming a first spacer 801 on a sidewall of the dummy gate stacks 701. The first spacer 801 may be an insulating dielectric material, for example, silicon dioxide, silicon nitride, SiOCN, or SiBCN. Other non-limiting examples of materials for the first gate spacer 801 include dielectric oxides (e.g., silicon oxide, hafnium oxide, or aluminum oxide), dielectric nitrides (e.g., silicon nitride), dielectric oxynitrides, or any combination thereof. The first spacer 801 material is deposited by a deposition process, for example, chemical vapor deposition (CVD) or physical vapor deposition (PVD). The first spacer material 801 is etched to a desired thickness 810. The first spacer 801 may have a thickness 810 in a range from about 5 to about 10 nm, or from about 6 to about 8 nm.

Figure 9:
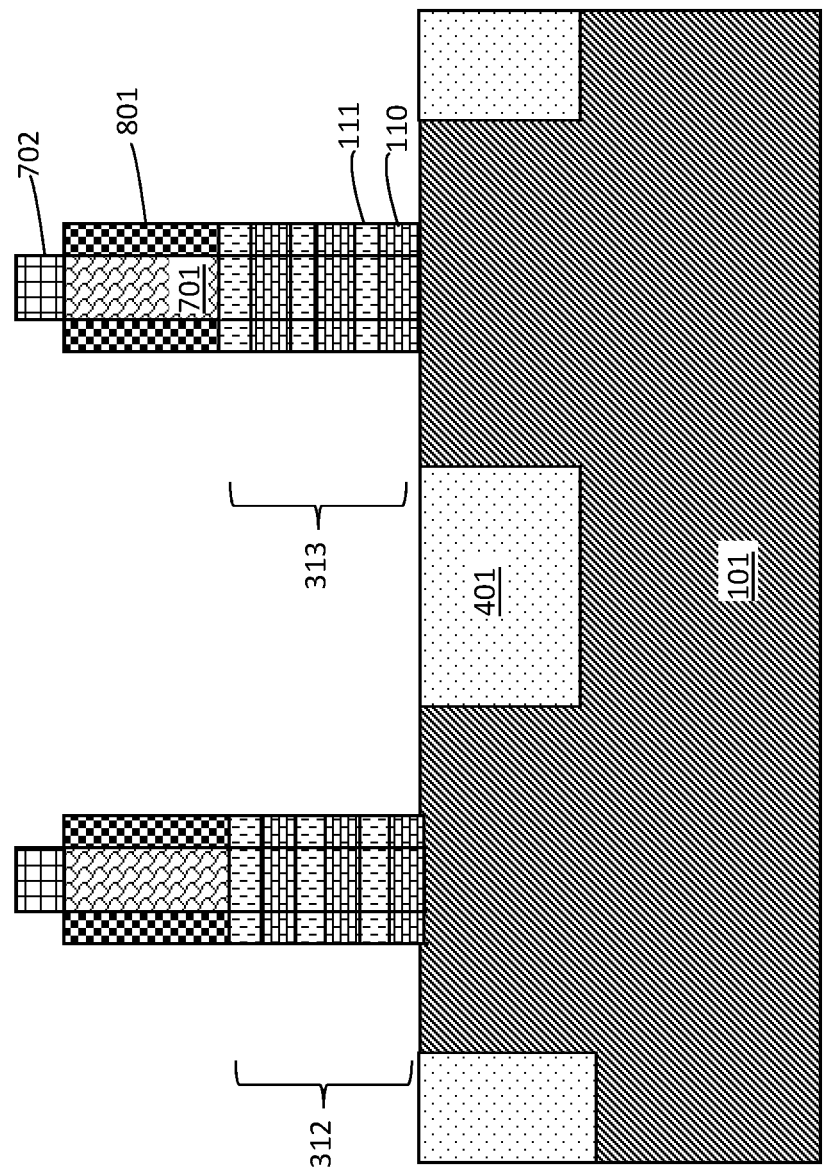

FIG. 9 is a cross-sectional side view after removing a portion of the excess layers extending beyond the first spacer 801. The layers may be etched using a silicon etch process. The endwall portions of layers in the first and second nanosheet stacks 312, 313 may substantially flush with the sidewall first spacer 801, as shown in the exemplary embodiment.

In another embodiment (not shown), the endwall portions of the layers may extend beyond the first spacer 801 such that a portion of the layers are protruding beyond the first spacer 801. A portion of the first spacer 801 may be partially removed/etched such that the layers protrude beyond a sidewall of the first spacer 801.

Figure 10:
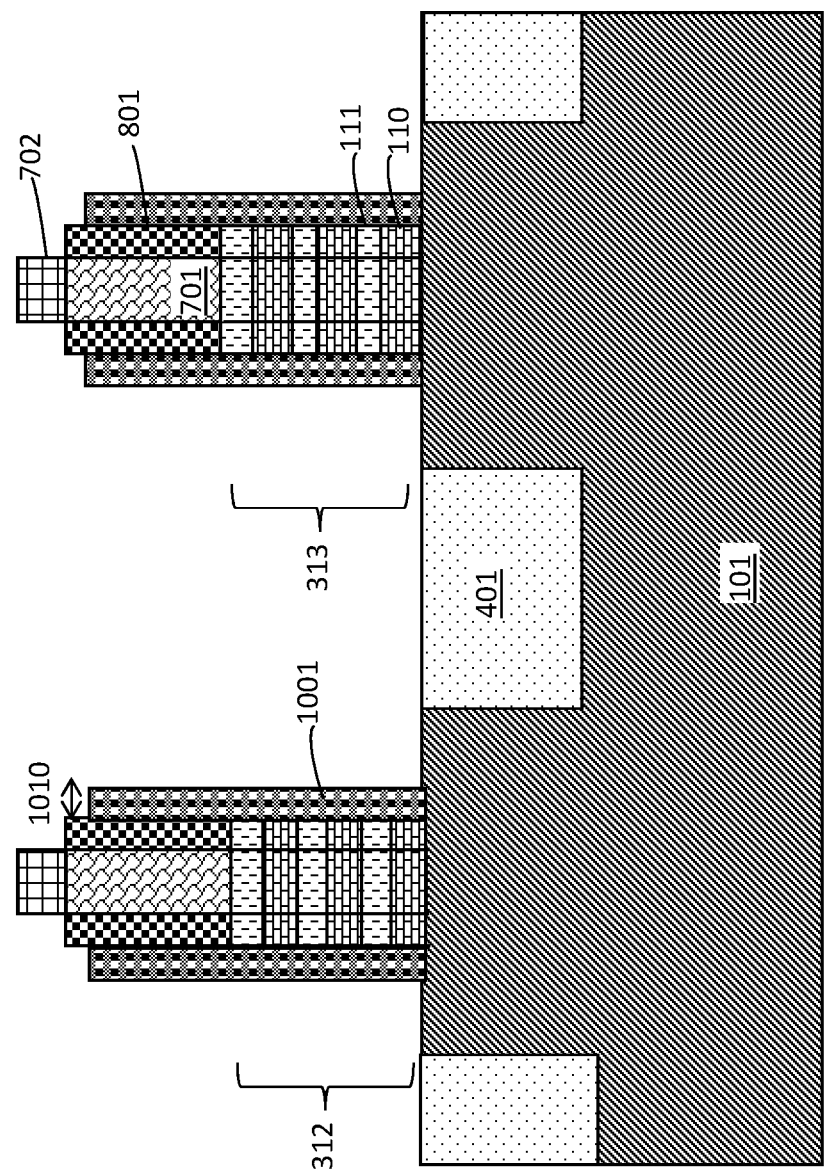

FIG. 10 is a cross-sectional side view after forming a second spacer 1001 on a sidewall of the first spacer 801. The second spacer 1001 covers exposed endwall portions of the layers that extend beyond sidewalls of the first spacer 801.

The second spacer 1001 may include the same material as the first spacer 801 or a different material than the first spacer 801. The second spacer 1001 may be an insulating dielectric material, for example, silicon dioxide, silicon nitride, SiOCN, or SiBCN. Other non-limiting examples of materials for the second spacer 1001 include dielectric oxides (e.g., silicon oxide, hafnium oxide, or aluminum oxide), dielectric nitrides (e.g., silicon nitride), dielectric oxynitrides, or any combination thereof. The second spacer 1001 material is deposited by a deposition process, for example, chemical vapor deposition (CVD) or physical vapor deposition (PVD). The second spacer 1001 material is etched to a desired thickness 1010. The second spacer 1001 may have a thickness 1010 in a range from about 5 to about 15 nm, or in a range from about 8 to about 12 nm.

Figure 11:
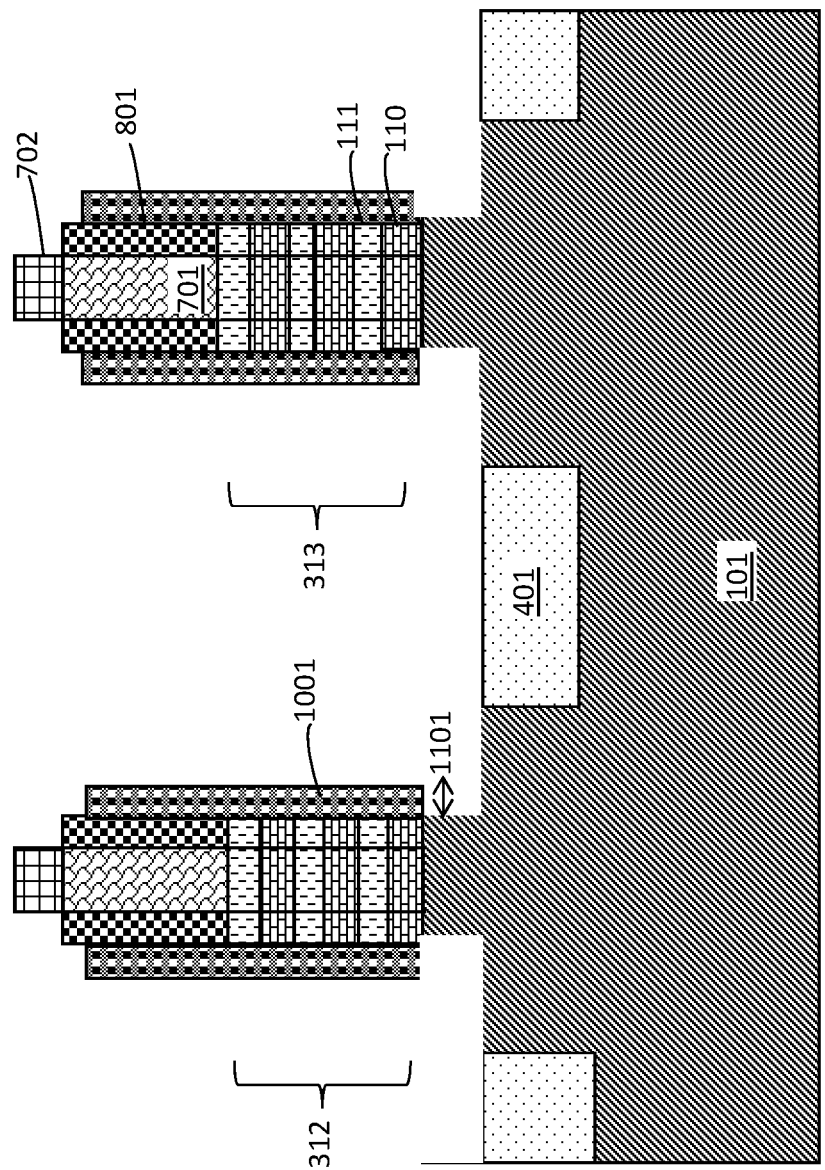

FIG. 11 is a cross-sectional side view after partially recessing the substrate 101 beneath the second spacer 1001. The substrate 101 may be recessed using a silicon recess process, for example, a wet etch process. In an exemplary embodiment, the wet etch process includes hydrobromic acid that is selective to (will not substantially remove) dielectric materials that may be present in the first spacer 801 and second spacer 1001.

A recess (undercut) is formed beneath the second spacer 1001. The depth 1101 of the undercut (width of the recess) is defined by the thickness 1010 of the second spacer 1001 (see FIG. 10). The depth 1101 of the recess is not limited and may have any dimensions such that the substrate 101 maintains physical stability. A portion of the substrate 101 abuts the first spacer 801.

Figure 12:
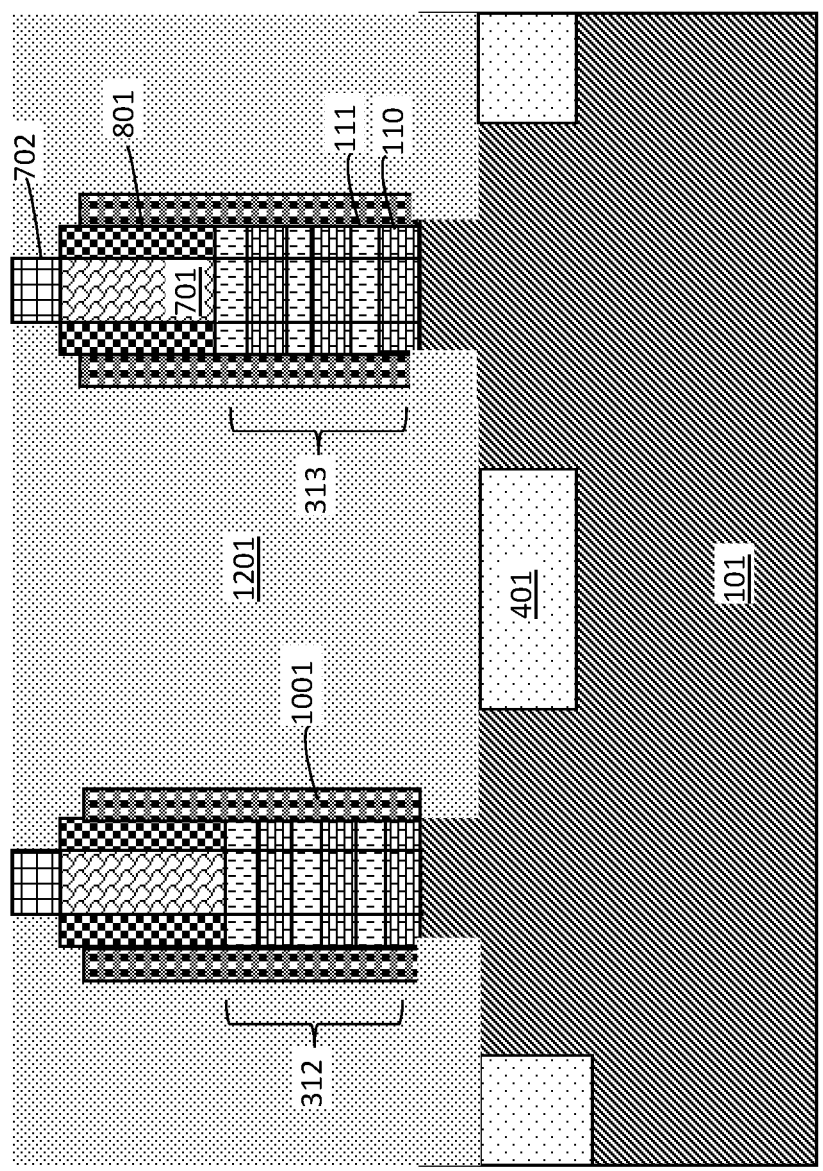

FIG. 12 is a cross-sectional side view after depositing an oxide 1201 on the dummy gate stacks 701 and the substrate 101. The oxide 1201 is deposited within the recessed portion of the substrate beneath the second spacer 1001.

Non-limiting examples of oxides 1201 include silicon dioxide, tetraethylorthosilicate (TEOS) oxide, high aspect ratio plasma (HARP) oxide, high temperature oxide (HTO), high density plasma (HDP) oxide, oxides (e.g., silicon oxides) formed by an atomic layer deposition (ALD) process, or any combination thereof. The oxide 1201 may be the same or different than the oxide 401. The deposited oxide 1201 is planarized/polished to the top of the hard mask layer 701 of the dummy gate stack 701. The deposited oxide 1201 may be planarized by, for example, chemical mechanical planarization (CMP).

Figure 13:
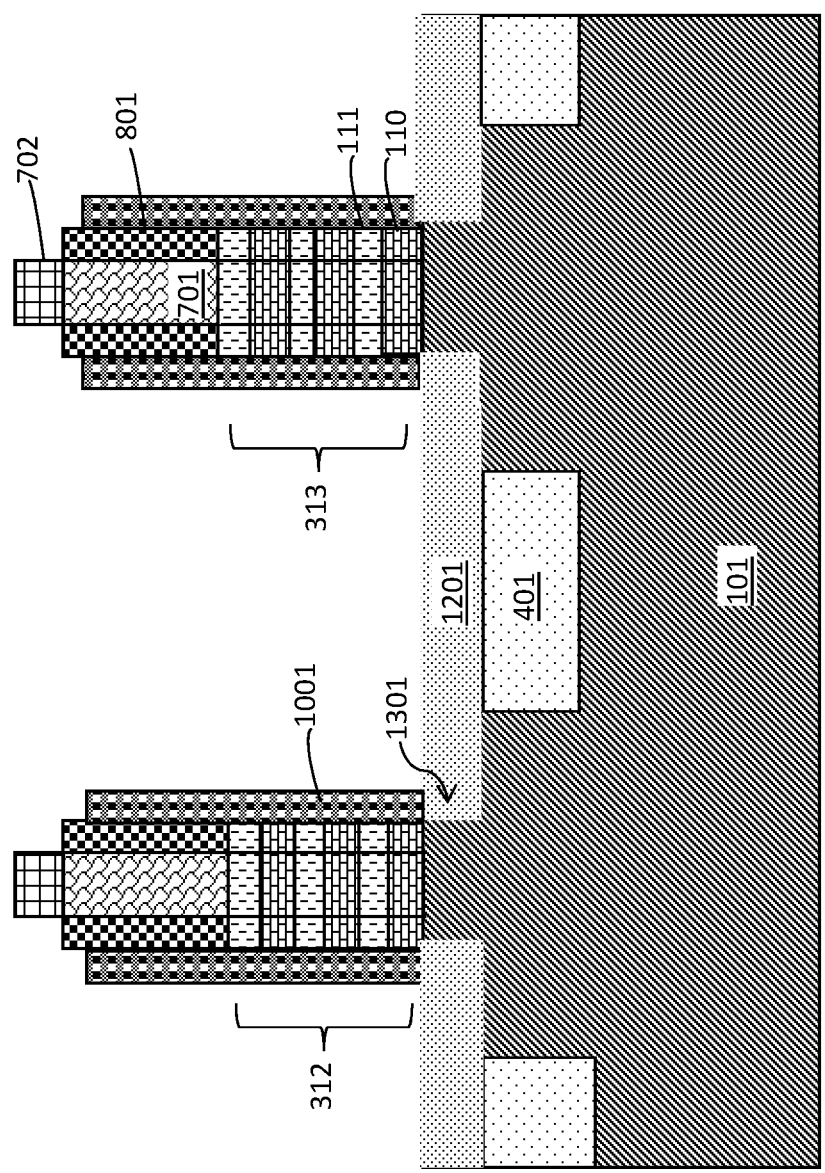

FIG. 13 is a cross-sectional side view after partially recessing the oxide 1201. A portion of the second spacer 1001 is exposed. The oxide 1201 may be etched by, for example, such as $C_4F_8/Ar/O_2$ or $C_5HF_7$. Recessing the oxide 1201 reveals the dummy gate stacks 701, the first spacer 801, and the second spacer 1001. A portion of the oxide 1201 remains beneath the second spacer 1001 and forms an isolation region 1301 filled with the oxide 1201 beneath the second spacer 1001.

Figure 14:
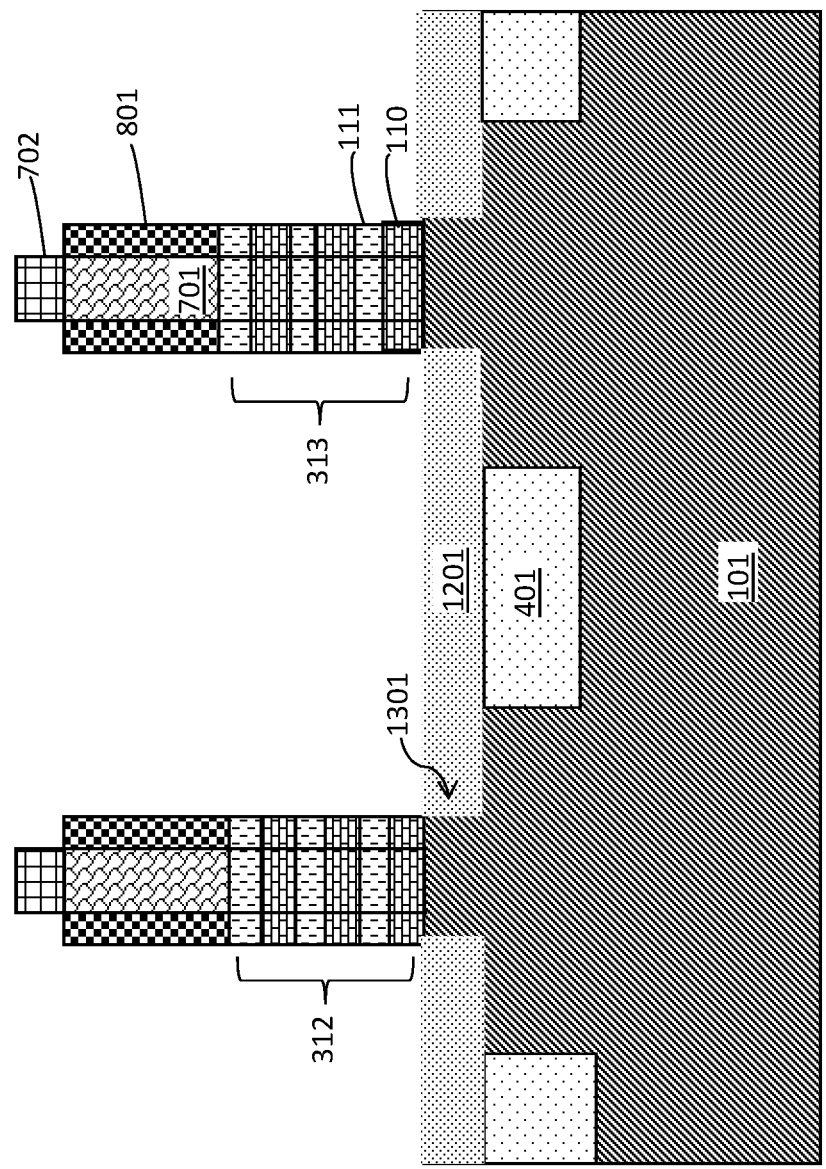

FIG. 14 is a cross-sectional side view after removing the second spacer 1001. The second spacer 1001 may be substantially completely removed, as shown in FIG. 14. Alternatively, the second spacer 1001 may be partially removed. Or, a portion of the second spacer 1001 may be removed such that at least some ends of layers in the nanosheet stacks are exposed.

The second spacer 801 may be reduced or substantially removed by a wet etch process, for example, hot phosphoric acid or hydrofluoric acid (HF) diluted by ethylene glycol (HFEG), or a dry etch process that isotropically etches the second spacer 801.

In some embodiments, a portion of the second spacer 1001 remains beneath the epitaxial layers 1501. In other embodiments, the second spacer 1001 is substantially completely removed.

Figure 15:
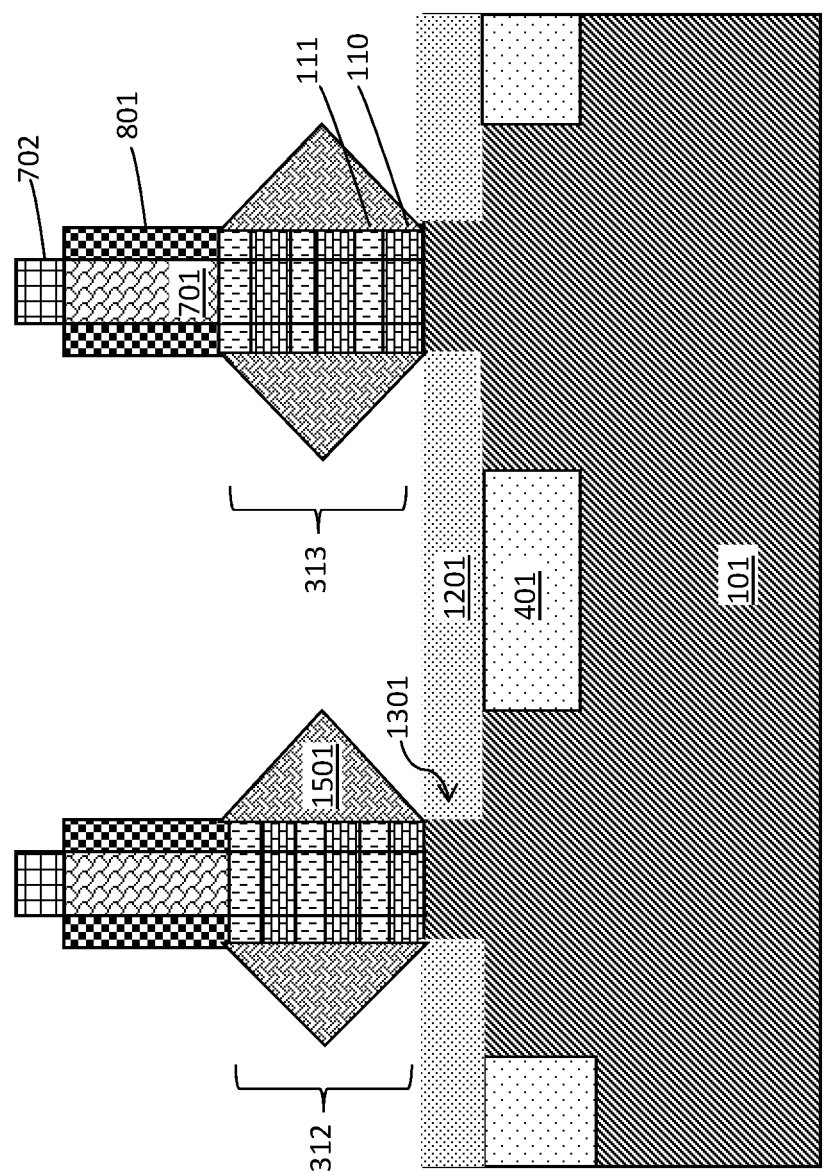

FIG. 15 is a cross-sectional side view after growing epitaxial layers 1501 over the isolation regions 1301. The epitaxial layers 1501 are grown on exposed end regions of the second layers 111, which is silicon in an embodiment. The epitaxial layers 1501 form the source/drain regions. The isolation regions 1301 beneath the source/drain regions (between the substrate and the source/drain) lower the parasitic junction capacitance between the source/drain and the substrate 101.

The epitaxial layers 1501 may include a semiconductor material, for example, silicon, germanium, or a combination thereof. The epitaxial layers 1501 may be grown using a suitable growth process, for example, chemical vapor deposition (CVD) (liquid phase (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

A number of different sources may be used for the deposition of the epitaxial layers 1501. In some embodiments, the gas source for the deposition of the epitaxial semiconductor material include a silicon containing gas source, a germanium containing gas source, or a combination thereof. For example, an epitaxial silicon layer may be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used.

After forming the source/drains, the device may be further processed to replace the dummy gate with a metal gate stack. An oxide may be deposited on the dummy gate stacks 701 and the recessed oxide 1201. A polishing/planarization process is performed to remove the hard mask layer 702 and expose the sacrificial gate material in the dummy gate stacks 701. The sacrificial gate material may be removed by performing a chemical etch process that is selective to (will not substantially etch) the first spacer 801 and the surrounding oxide. The chemical etch process may include, but is not limited to, reactive ion etch (RIE), plasma etch, aqueous etching containing an etchant of ammonia, or any suitable combination thereof.

Removing the sacrificial gate material exposes the layers in the nanosheet stacks. The first layers 110 are removed within the dummy gate trench by a selective etch process, leaving the second layers 111 substantially intact within the dummy gate trench. Remaining portions of the first layers 110 may be removed by performing a selective wet etch process that may include, for example, buffered hydrofluoric acid (BHF), hydrofluoric acid (HF), hydrofluoric nitric acid (HNA), phosphoric acid, HF diluted by ethylene glycol (HFEG), hydrochloric acid (HCl), or any combination thereof.

The lateral (endwall) portions of the first layers 110 remain anchored beneath the first spacer 801. The exposed first layer 110 may be removed by performing a selective wet etch process. The second layers 111 remain suspended in the gate region, with recesses formed between the suspended second layers 111 where the first layers 110 were removed. The second layers 111 form nanosheet channel regions.

A metal gate stack is then deposited within the gate trench over the channel regions. The gate stacks include metal gates formed, for example, by filling a dummy gate opening (not shown) with one or more dielectric materials, one or more workfunction metals, and one or more metal gate conductor materials. The gate dielectric material(s) can be a dielectric material having a dielectric constant greater than 3.9, 7.0, or 10.0. Non-limiting examples of suitable materials for the dielectric material include oxides, nitrides, oxynitrides, silicates (e.g., metal silicates), aluminates, titanates, nitrides, or any combination thereof. Examples of high-k dielectric materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The gate dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material may vary depending on the deposition process as well as the composition and number of high-k dielectric materials used. The dielectric material layer may have a thickness in a range from about 0.5 to about 20 nm.

The work function metal(s) may be disposed over the gate dielectric material. The type of work function metal(s) depends on the type of transistor. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, CVD, PECVD, PVD, plating, thermal or e-beam evaporation, and sputtering.

A conductive metal is deposited over the dielectric material(s) and workfunction layer(s) to form the gate stacks. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering. A planarization process, for example, chemical mechanical planarization (CMP), is performed to polish the surface of the conductive gate metal.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of making features of a semiconductor device, the method comprising:
depositing and patterning a gate stack on a nanosheet stack, the nanosheet stack comprising a first layer and a second layer, and a first spacer arranged on a sidewall of the gate stack;
depositing a second spacer along a sidewall of the first spacer;
recessing the substrate beneath the second spacer to form an isolation region beneath the second spacer;
depositing an oxide on the gate stack and within the isolation region and partially recessing the oxide to expose the second spacer;
removing a portion of the second spacer such that the portion of the second layer of the nanosheet stack is exposed; and
growing by an epitaxial process an epitaxial layer on the portion of the second layer that is exposed to form a source/drain over the isolation region.

2. The method of claim 1, wherein the first spacer and the second spacer comprise a different material.

3. The method of claim 1, wherein the portion of the second layer that is exposed from the sidewall of the first spacer after removing the endwall portion of the nanosheet stack protrudes from the sidewall of the first spacer.

4. The method of claim 1, wherein depositing the second spacer covers the portion of the second layer that is exposed.

5. The method of claim 1, wherein recessing the substrate beneath the second spacer comprises a silicon recess process with hydrobromic acid.

6. The method of claim 1, wherein recessing the substrate comprises an etch that is selective to dielectrics.

7. The method of claim 1, wherein the oxide remains within the isolation region beneath the second spacer after partially recessing the oxide.

8. The method of claim 1, wherein removing a portion of the second spacer comprises substantially completely removing the second spacer.

9. The method of claim 1, wherein the second layer comprises silicon, and the epitaxial layer comprises epitaxial silicon.

10. The method of claim 1, wherein the first spacer and the second spacer comprise the same material.

11. The method of claim 1, wherein the recess within the substrate is filled with the oxide to form an isolation region between the source/drain and the substrate.

12. The method of claim 11, wherein the oxide is silicon dioxide, tetraethylorthosilicate (TEOS) oxide, high aspect ratio plasma (HARP) oxide, high temperature oxide (HTO), high density plasma (HDP) oxide, or a combination thereof.

13. The method of claim 1, wherein partially recessing the oxide comprises a process comprising $C_4F_8/Ar/O_2$.

14. The method of claim 1, wherein partially recessing the oxide comprises a process comprising $C_5HF_7$.

15. The method of claim 1, wherein the first spacer is an insulating dielectric material.

16. The method of claim 15, wherein the insulating dielectric material is silicon dioxide, silicon nitride, SiOCN, or SiBCN.

17. The method of claim 1, wherein the second spacer is an insulating dielectric material.

18. The method of claim 17, wherein the insulating dielectric material is silicon dioxide, silicon nitride, SiOCN, or SiBCN.

19. The method of claim 1, wherein the first layer is a sacrificial material.

20. The method of claim 1, wherein the second layer is a semiconductor material.

* * * * *